(12) United States Patent
Wang et al.

(10) Patent No.: US 10,833,179 B2
(45) Date of Patent: Nov. 10, 2020

(54) METHOD OF MAKING SPLIT GATE NON-VOLATILE FLASH MEMORY CELL

(71) Applicant: Silicon Storage Technology, Inc., San Jose, CA (US)

(72) Inventors: Chunming Wang, Shanghai (CN); Leo Xing, Shanghai (CN); Andy Liu, Shanghai (CN); Melvin Diao, Shanghai (CN); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/576,389

(22) Filed: Sep. 19, 2019

(65) Prior Publication Data

US 2020/0013883 A1    Jan. 9, 2020

Related U.S. Application Data

(62) Division of application No. 16/287,581, filed on Feb. 27, 2019, now Pat. No. 10,615,270, which is a
(Continued)

(30) Foreign Application Priority Data

May 18, 2016   (CN) .......................... 2016 1 0330742

(51) Int. Cl.
*H01L 27/11521* (2017.01)
*H01L 27/11531* (2017.01)
(Continued)

(52) U.S. Cl.
CPC .. *H01L 29/66825* (2013.01); *H01L 21/32133* (2013.01); *H01L 21/32135* (2013.01);
(Continued)

(58) Field of Classification Search
CPC ......... H01L 29/66825; H01L 29/42324; H01L 29/42328; H01L 29/7881; H01L 29/41775;
(Continued)

(56) References Cited

U.S. PATENT DOCUMENTS 5,242,848 A    9/1993  Yeh
6,436,764 B1   8/2002  Hsieh
(Continued)

FOREIGN PATENT DOCUMENTS

CN    102956554 A    3/2013
CN    102956563      3/2013
(Continued)

*Primary Examiner* — Michael M Trinh
(74) *Attorney, Agent, or Firm* — DLA Piper LLP (US)

(57) ABSTRACT

A method of forming a non-volatile memory cell on a substrate having memory cell and logic circuit regions by forming a pair of conductive floating gates in the memory cell region, forming a first source region in the substrate between the pair of floating gates, forming a polysilicon layer in both regions, forming an oxide layer over the polysilicon layer in the logic circuit region, performing a chemical-mechanical polish of the polysilicon layer in the memory cell area leaving a first block of the polysilicon layer between the floating gates that is separated from remaining portions of the polysilicon layer, and selectively etching portions of the polysilicon layer to result in: second and third blocks of the polysilicon layer disposed in outer regions of the memory cell area, and a fourth block of the polysilicon layer in the logic circuit region.

2 Claims, 34 Drawing Sheets

Related U.S. Application Data division of application No. 15/494,499, filed on Apr. 22, 2017, now Pat. No. 10,276,696.

(51) Int. Cl.

| | | |
|---|---|---|
| *H01L 29/66* | (2006.01) | |
| *H01L 21/3213* | (2006.01) | |
| *H01L 27/11536* | (2017.01) | |
| *H01L 29/423* | (2006.01) | |
| *H01L 49/02* | (2006.01) | |

(52) U.S. Cl.
CPC .. *H01L 21/32139* (2013.01); *H01L 27/11521* (2013.01); *H01L 27/11531* (2013.01); *H01L 27/11536* (2013.01); *H01L 28/00* (2013.01); *H01L 29/423* (2013.01); *H01L 29/42328* (2013.01)

(58) Field of Classification Search
CPC .......... H01L 29/41783; H01L 29/7883; H01L 27/11531; H01L 27/11536; H01L 27/11521; H01L 27/11541; H01L 27/11517; H01L 21/31051; H01L 21/304
See application file for complete search history.

(56) References Cited

U.S. PATENT DOCUMENTS

| | | | |
|---|---|---|---|
| 6,541,324 B1 | 4/2003 | Wang | |
| 6,747,310 B2 | 6/2004 | Fan et al. | |
| 7,053,438 B2 * | 5/2006 | Ding | H01L 27/105 257/314 |
| 7,598,561 B2 | 10/2009 | Chen | |
| 7,868,375 B2 | 1/2011 | Liu et al. | |
| 8,043,951 B2 | 10/2011 | Beugin | |
| 8,173,514 B2 | 5/2012 | Ogura | |
| 9,276,005 B1 | 3/2016 | Zhou et al. | |
| 9,343,466 B1 | 5/2016 | Zhang | |
| 9,496,369 B2 * | 11/2016 | Wu | H01L 29/42328 |
| 2007/0152262 A1 | 7/2007 | Han | |
| 2009/0039410 A1 | 2/2009 | Liu | |
| 2011/0076816 A1 | 3/2011 | Liu et al. | |
| 2012/0104483 A1 | 5/2012 | Shroff et al. | |
| 2014/0203343 A1 | 7/2014 | Wang et al. | |
| 2014/0264538 A1 | 9/2014 | Yu et al. | |
| 2015/0014761 A1 | 1/2015 | Hsu et al. | |
| 2015/0263040 A1 | 9/2015 | Su et al. | |
| 2015/0280004 A1 * | 10/2015 | Wu | H01L 21/02595 257/321 |
| 2016/0181266 A1 * | 6/2016 | Chuang | H01L 27/11541 257/316 |
| 2016/0218110 A1 | 7/2016 | Yang et al. | |
| 2016/0358928 A1 * | 12/2016 | Wu | H01L 29/7831 |
| 2017/0012049 A1 | 1/2017 | Yang et al. | |
| 2017/0103991 A1 | 4/2017 | Kim et al. | |

FOREIGN PATENT DOCUMENTS

| | | |
|---|---|---|
| CN | 105575784 | 5/2016 |
| JP | 2015-130438 | 7/2015 |
| KR | 10-2016003927 A | 4/2016 |

* cited by examiner

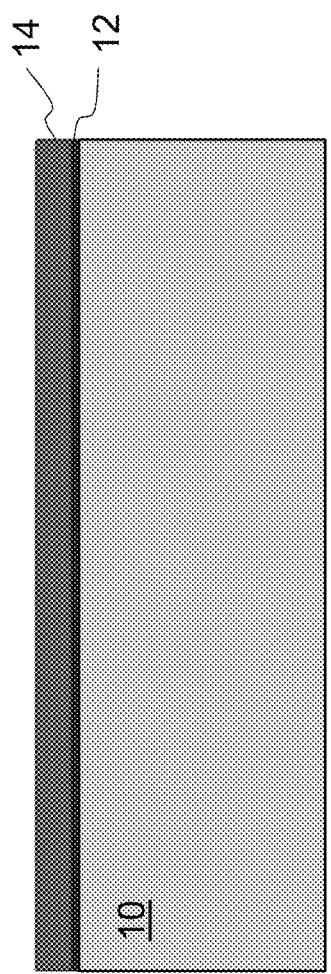
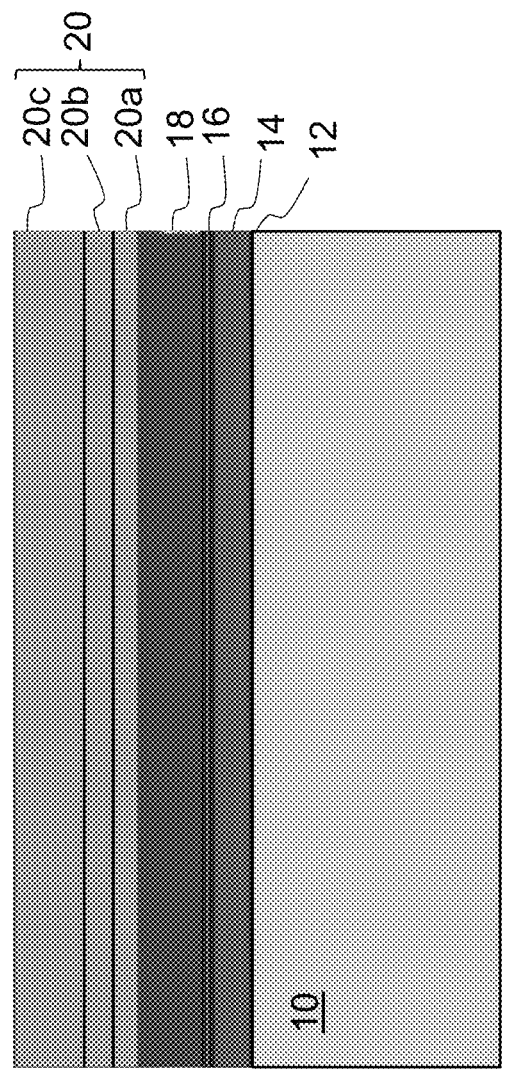
FIG. 1A
FIG. 1B

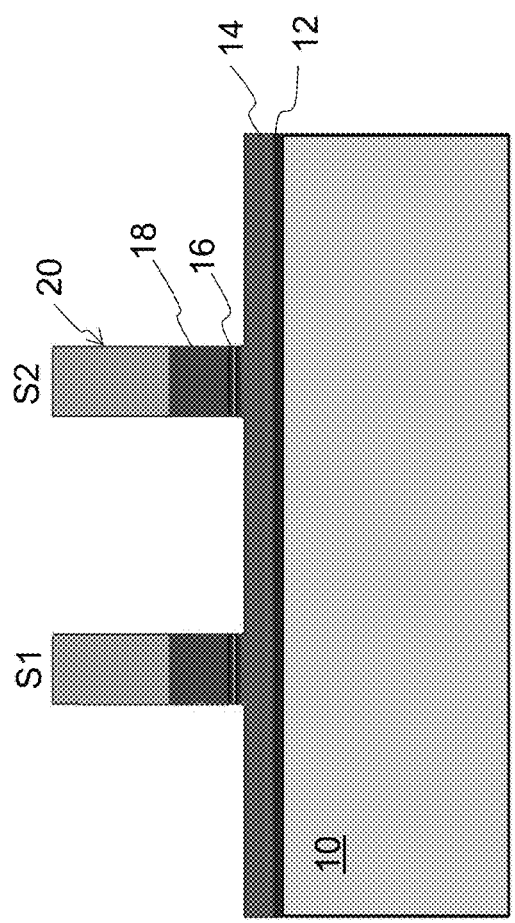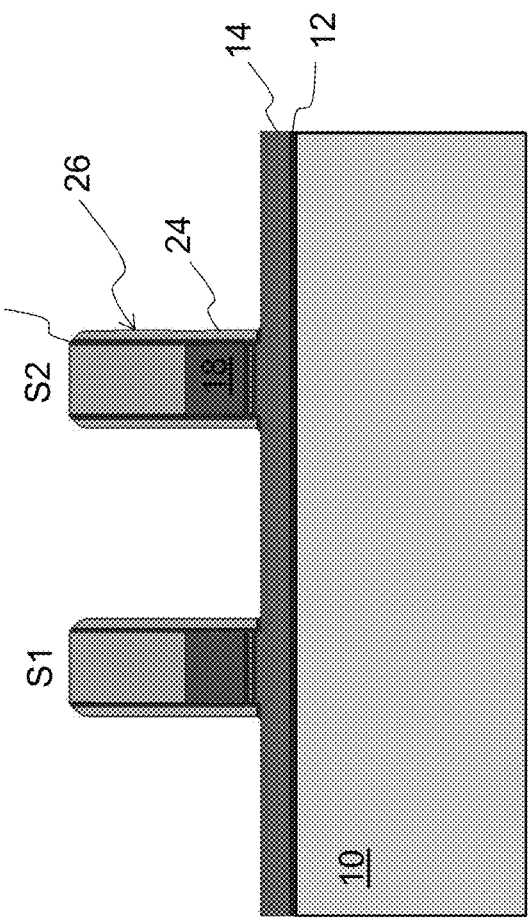

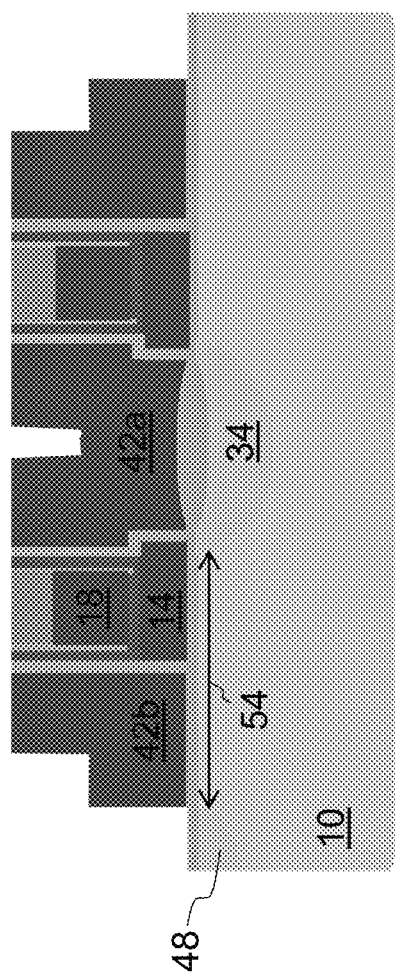
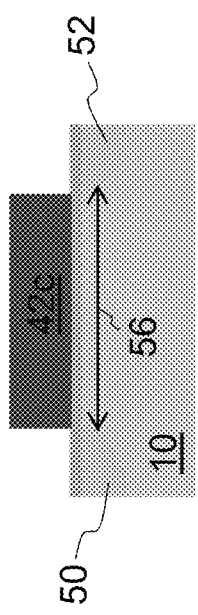
FIG. 2C
FIG. 3C

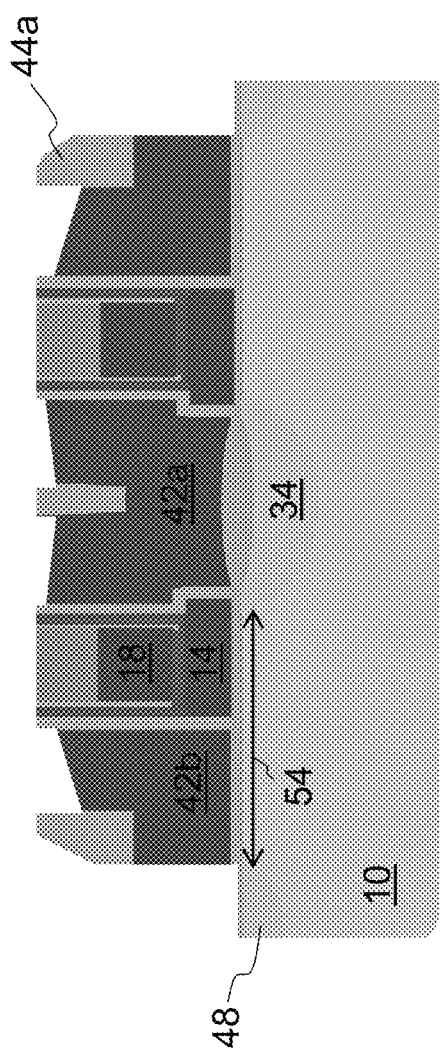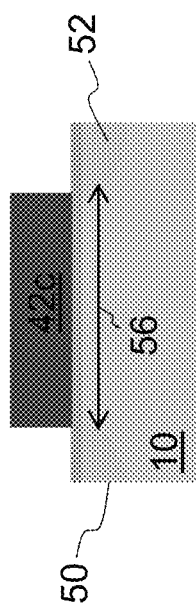

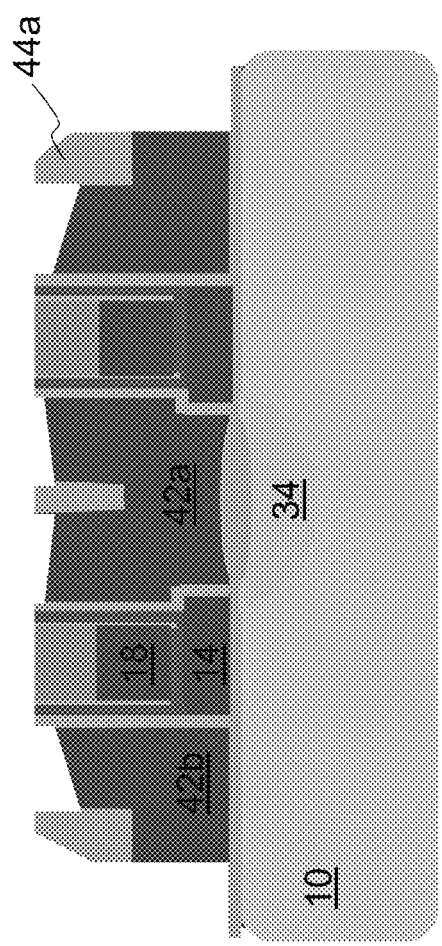
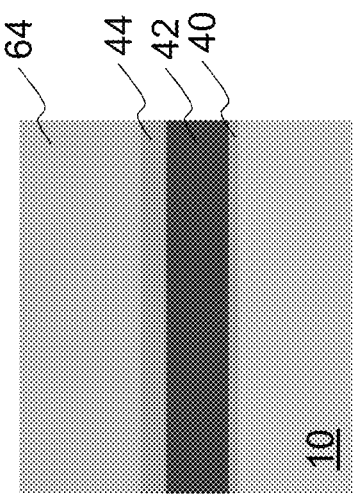
FIG. 7B
FIG. 8B

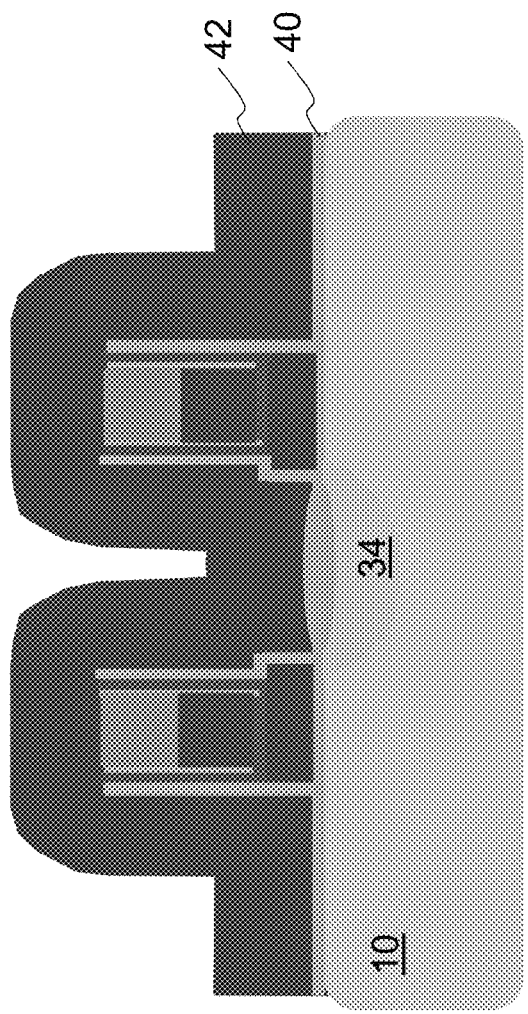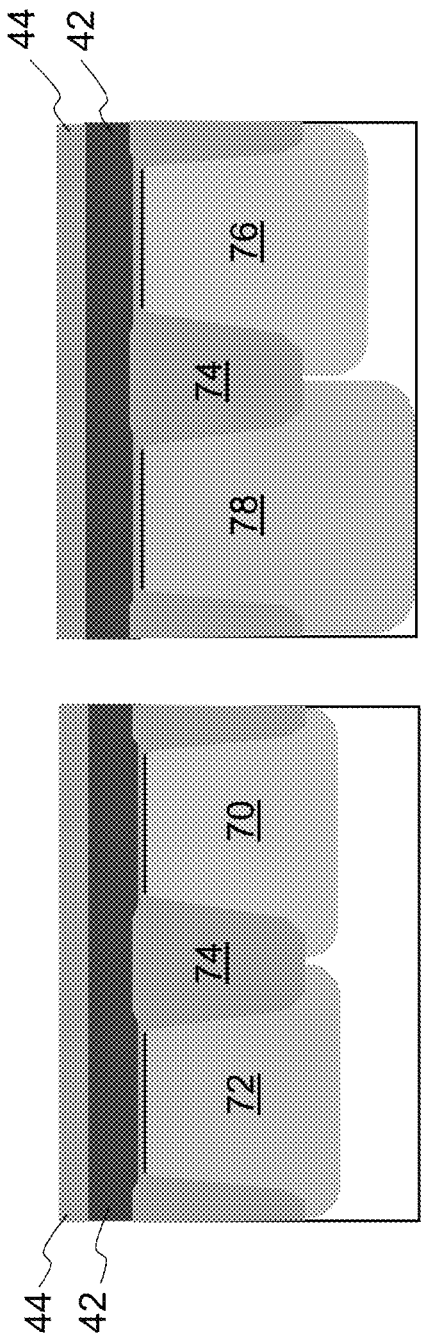

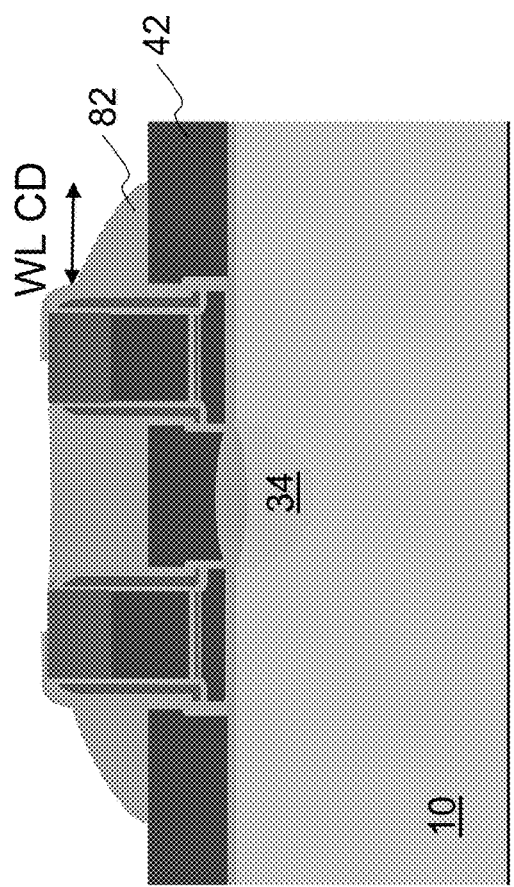
FIG. 9C
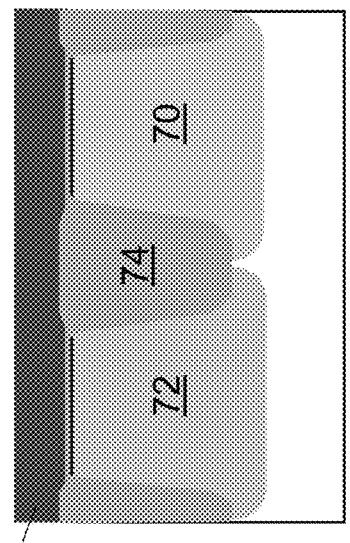
FIG. 11C
FIG. 10C

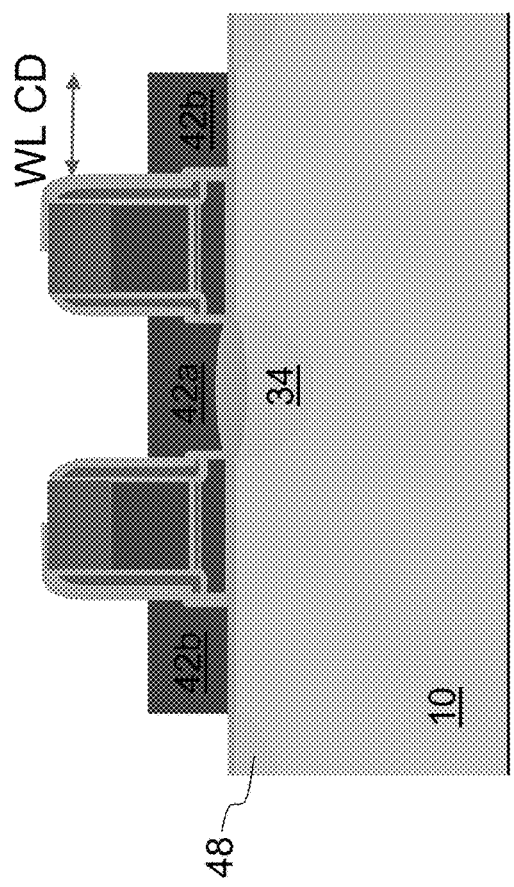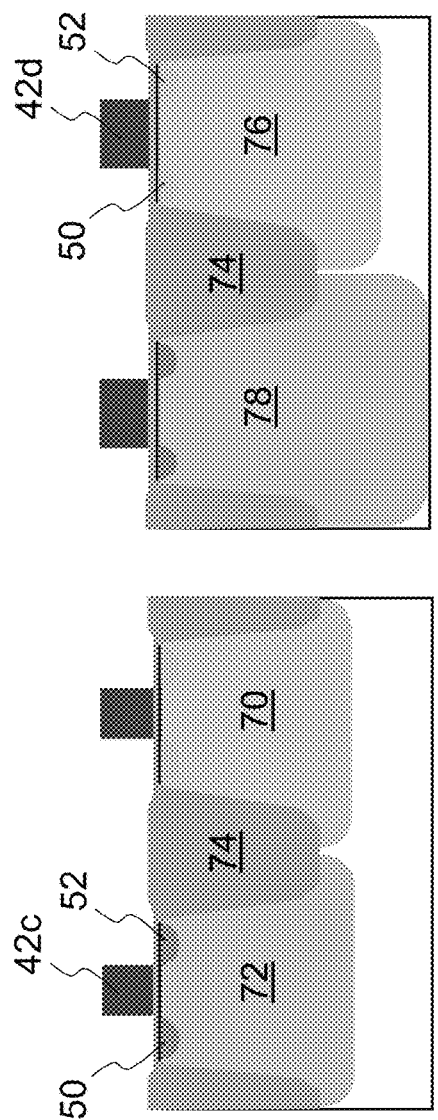

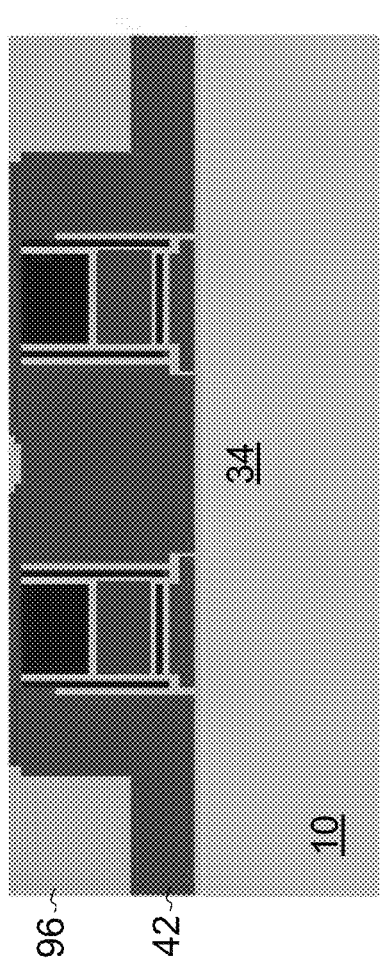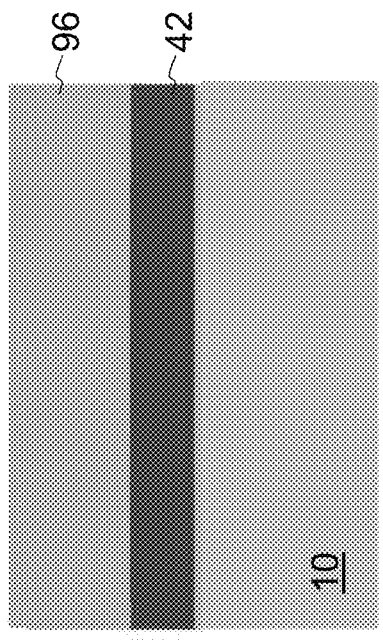

METHOD OF MAKING SPLIT GATE NON-VOLATILE FLASH MEMORY CELL

RELATED APPLICATION

This application is a divisional of U.S. patent application Ser. No. 16/287,581, filed Feb. 27, 2019, which is a divisional of U.S. patent application Ser. No. 15/494,499, filed Apr. 22, 2017, which claims the benefit of Chinese Patent Application No. 201610330742.X filed May 18, 2016, and which are incorporated herein by reference.

TECHNICAL FIELD

The present invention relates to a non-volatile flash memory cell which has a select gate, a floating gate, a control gate, and an erase gate.

BACKGROUND OF THE INVENTION

Split gate non-volatile flash memory cells having a select gate (also referred to as a word line gate), a floating gate, a control gate and an erase gate are well known in the art. See for example U.S. Pat. Nos. 6,747,310 and 7,868,375. An erase gate having an overhang over the floating gate is also well known in the art. See for example, U.S. Pat. No. 5,242,848. All three of these patents are incorporated herein by reference in their entirety.

It is also known to form memory cells having four gates (select, control, erase, floating) and logic circuits on the same substrate. See for example U.S. patent publication 2015-0263040. However, control of relative dimensions can be difficult. The present invention includes methodology for simpler and more robust formation of the select gate, erase gate and logic gate.

SUMMARY OF THE INVENTION

A method of forming a non-volatile memory cell includes providing a semiconductor substrate having a memory cell region and a logic circuit region, forming a pair of conductive floating gates disposed over and insulated from the memory cell region of the substrate, forming a first source region in the substrate between the pair of floating gates, forming a polysilicon layer over and insulated from the substrate in the memory cell region and the logic circuit region, wherein the polysilicon layer extends up and over, and is insulated from, the pair of conductive floating gates, and performing a spin-on process to form a coating over the polysilicon layer in the memory cell and logic circuit regions. The method further includes performing a non-selective etch to remove upper portions of the coating and the polysilicon layer to result in a first block of the polysilicon layer disposed over the substrate and between the pair of conductive floating gate, a second block of the polysilicon layer disposed over the substrate with one of the pair of floating gates disposed between the first and second blocks of the polysilicon layer, a third block of the polysilicon layer disposed over the substrate with the other of the pair of floating gates disposed between the first and third blocks of the polysilicon layer, and a fourth block of the polysilicon layer disposed over and insulated from the logic circuit portion of the substrate. The method further includes forming a first drain region in the substrate adjacent a side of the second block of the polysilicon layer, forming a second drain region in the substrate adjacent a side of the third block of the polysilicon layer, forming a third drain region in the substrate adjacent a first side of the fourth block of the polysilicon layer, and forming a second source region in the substrate adjacent a second side of the fourth block of the polysilicon layer opposite the first side of the fourth block.

Other objects and features of the present invention will become apparent by a review of the specification, claims and appended figures.

BRIEF DESCRIPTION OF THE DRAWINGS

FIGS. 1A-1H are cross sectional views illustrating the steps in forming the memory cell stacks of the present invention.

FIGS. 2A-2C and 3A-3C are cross sectional views illustrating steps in forming the memory cells and the logic devices, respectively.

FIGS. 5A-5C and 6A-6C are cross sectional views illustrating steps of an alternate embodiment in forming the memory cells and the logic devices, respectively.

FIGS. 7A-7C and 8A-8C are cross sectional views illustrating steps of an alternate embodiment in forming the memory cells and the logic devices, respectively.

FIGS. 9A-9E and 10A-10E and 11A-11E are cross sectional views illustrating steps of an alternate embodiment in forming the memory cells, the low voltage logic devices and the high voltage logic devices, respectively.

FIGS. 16A-16D and 17A-17D are cross sectional views illustrating steps of an alternate embodiment in forming the memory cells and the logic devices, respectively.

DETAILED DESCRIPTION OF THE INVENTION

Figure 1E:
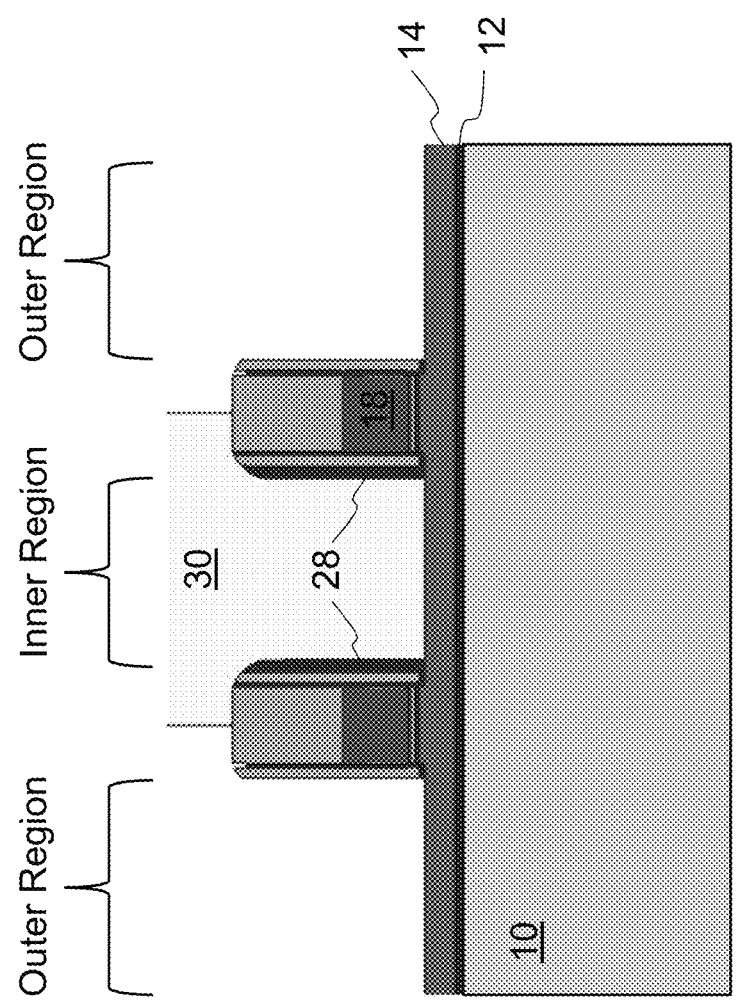

Referring to FIGS. 1A-1H there are shown cross-sectional views of the beginning steps in the process to make a memory cell. The process begins by forming a layer of silicon dioxide (oxide) 12 on a substrate 10 of P type single crystalline silicon. Thereafter a first layer 14 of polysilicon (or amorphous silicon) is formed on the layer 12 of silicon dioxide, as illustrated in FIG. 1A. The first layer 14 of polysilicon is subsequently patterned in a direction perpendicular to the view of FIG. 1A.

Another insulating layer 16, such as silicon dioxide (or even a composite layer, such as ONO (oxide, nitride, oxide)) is formed on the first layer 14 of polysilicon. A second layer 18 of polysilicon is then formed on the oxide layer 16. Another insulating layer 20 is formed on the second layer 18 of polysilicon and used as a hard mask during subsequent dry etching. In the preferred embodiment, the layer 20 is a composite layer, comprising silicon nitride 20a, silicon dioxide 20b, and silicon nitride 20c. The resulting structure is shown in FIG. 1B. It should be noted that the hard mask 20 may instead be a composite layer of silicon oxide 20b and silicon nitride 20c, or just a thick silicon nitride (nitride) layer 20a.

Photoresist material (not shown) is coated on the structure, and a masking step is performed exposing selected portions of the photoresist material. The photoresist is developed and using the photoresist as a mask, the structure is etched. Specifically, the composite layer 20, the second layer 18 of polysilicon and the insulating layer 16 are anisotropically etched, until the first layer 14 of polysilicon is exposed. The resultant structure is shown in FIG. 1C. Although only two "stacks" S1 and S2 are shown, it should be clear that there are a number of such "stacks" that are separated from one another.

Silicon dioxide 22 is formed on the structure. This is followed by the formation of silicon nitride layer 24. The silicon nitride 24 and silicon dioxide 22 are anisotropically etched leaving a composite spacers 26 (which is the combination of the silicon dioxide 22 and silicon nitride 24) alongside the stacks S1 and S2. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). The resultant structure is shown in FIG. 1D.

A layer of oxide is formed over the structure, followed by an anisotropical etch leaving spacers 28 of the oxide alongside the stacks S1 and S2. A photoresist 30 is formed over the regions between the stacks S1 and S2, and other alternating pairs of stacks S1 and S2. The region between the pair of stacks S1 and S2 is referred to herein as the "inner region" and the regions outside of the inner region (i.e. between adjacent pairs of stacks S1 and S2) are referred to as the "outer regions". The exposed spacers 28 in the outer regions are removed by isotropic etch. The resulting structure is shown in FIG. 1E.

Figure 1F:
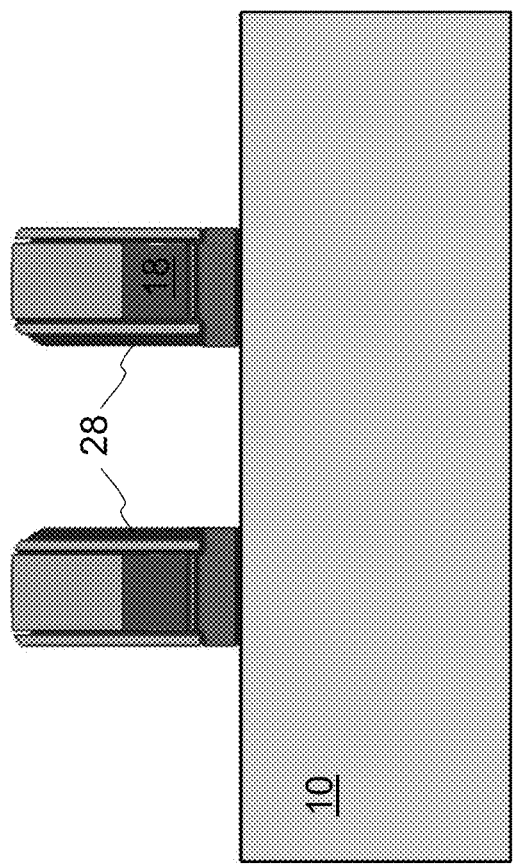

After the photoresist 30 is removed, the exposed portions first polysilicon layer 14 in the inner and outer regions are anisotropically etched. Part of oxide layer 12 will also be etched (removed) during the poly over-etching. A thinner layer of remaining oxide will preferably stay on the substrate 10 so as to prevent damage to the substrate 10. The resultant structure is shown in FIG. 1F.

Figure 1G:
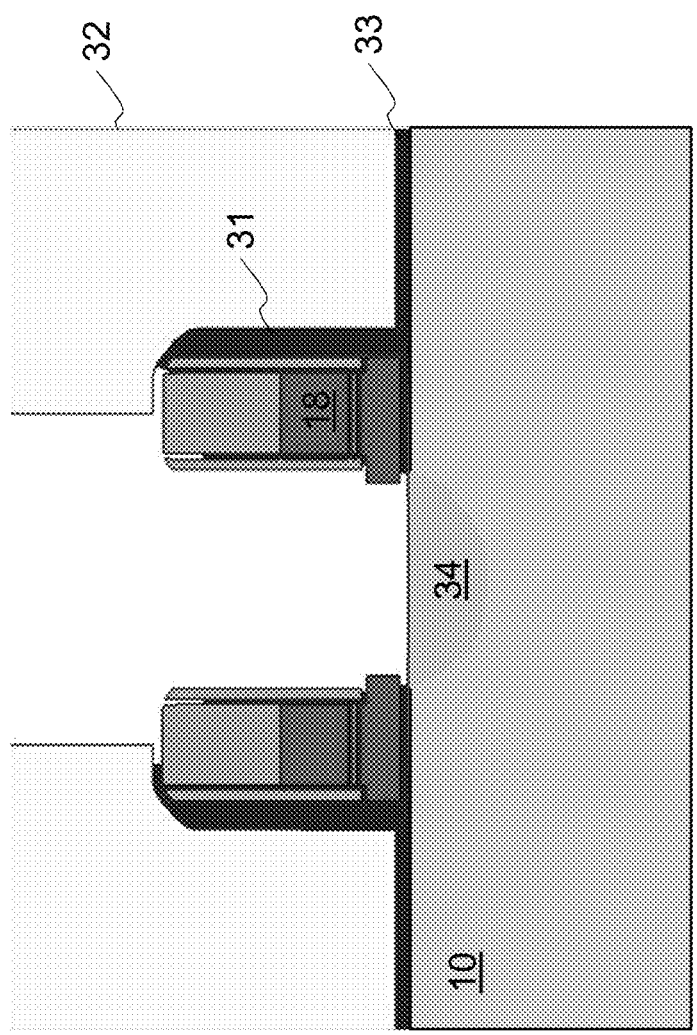

A layer of oxide is formed over the structure, followed by an anisotropical etch leaving spacers 31 of the oxide alongside the stacks S1 and S2 and a layer 33 of oxide on substrate 10. Optionally, another oxide layer for HV MOS gate oxide is formed over the structure, thickening spacers 31 and layer 33. Photoresist material 32 is then coated and masked leaving openings in the inner regions between the stacks S1 and S2. Again, similar to the drawing shown in FIG. 1E, the photoresist is between other alternating pairs of stacks. The resultant structure is subject to an ion implant into exposed portions of substrate 10 in the inner regions, forming source region 34. The oxide spacers 31 adjacent to the stacks S1 and S2 and oxide layer 33 in the inner region are then removed by e.g. a wet etch. The resultant structure is shown in FIG. 1G.

Figure 1H:
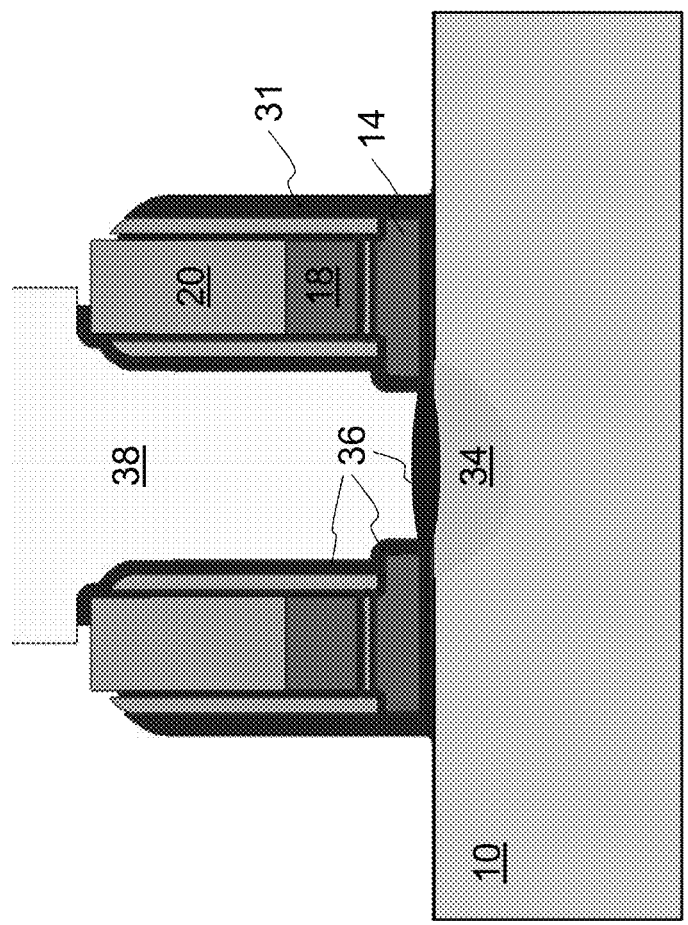

The photoresist material 32 in the outer regions of the stacks S1 and S2 is removed. A high-temperature thermal annealing step is applied to activate the ion implant to complete the formation of the source junction (i.e. first or source region 34). Silicon dioxide 36 is formed everywhere. The structure is once again covered by photoresist material 38 and a masking step is performed exposing the outer regions of the stacks S1 and S2 and leaving photoresist material 38 covering the inner region between the stacks S1 and S2. An oxide anisotropical etch followed by isotropic wet etch are performed, to remove oxide 36 and oxide 33 from the outer regions of stacks S1 and S2, and possibly to reduce the thickness of the oxide spacers 31 in the outer regions of the stacks S1 and S2. The resultant structure is shown in FIG. 1H.

Figure 2A:
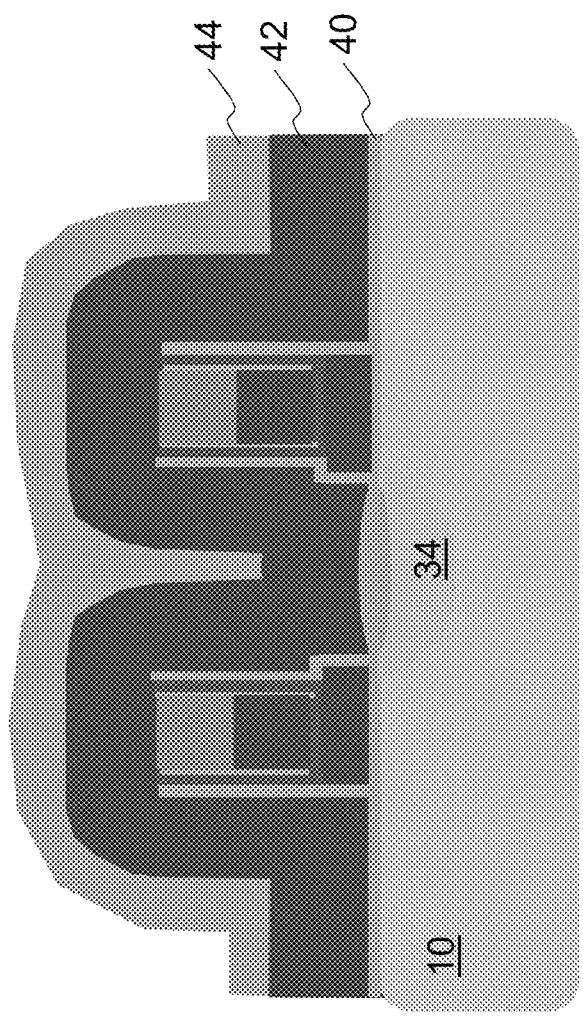
Figure 3A:
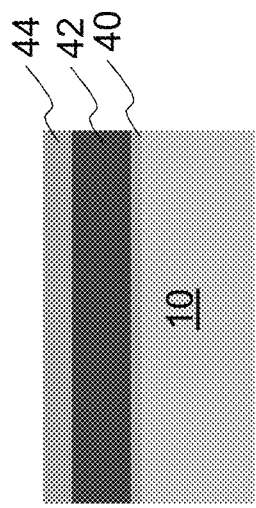
Figure 2B:
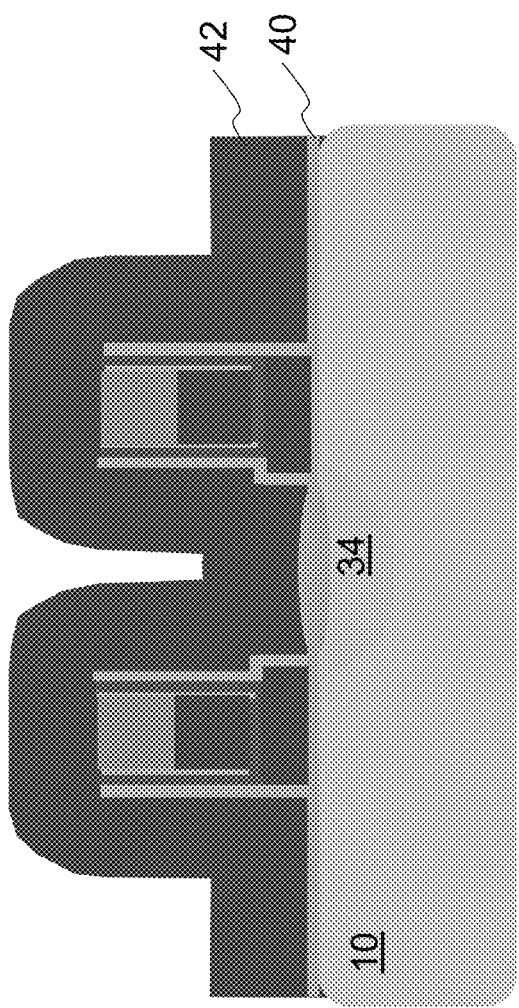
Figure 3B:
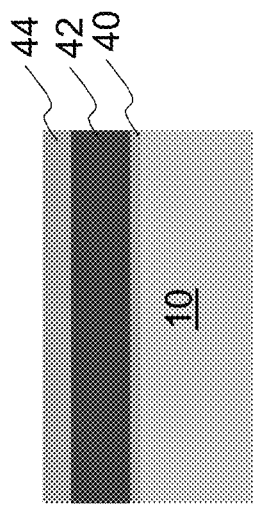

FIGS. 2A-2C are cross-sectional views illustrating the next steps in the process to make a memory cell in the memory cell region of substrate 10, and FIGS. 3A-3C are cross-sectional views illustrating the next steps in the process to make logic devices in the logic circuit region of substrate 10. After photoresist material 38 is removed, an insulation layer 40 (e.g. oxide) is formed on the exposed portions of substrate 10 in the outer regions and logic circuit region. A conformal layer of polysilicon 42 is then deposited over the structure. Depending on the thickness of poly layer 42, it may merge over source region 34, or not as shown. A buffer oxide 44 is then deposited on poly layer 42 in both areas. The resulting structure is shown in FIGS. 2A and 3A.

Photoresist is coated on the structure, and selectively removed via a photolithography process from the memory cell area of the substrate. An oxide etch is used to remove the buffer oxide 44 from the memory cell region, as shown in FIGS. 2B and 3B (after photoresist removal). A CMP (chemical-mechanical polish) is used to planarize the top of the memory cell stack structure. An oxide etch is used to remove buffer oxide 44 in the logic circuit region. Photoresist is coated on the structure and selectively removed from portions of the logic circuit region and memory cell region. A poly etch is then used to remove exposed portions of poly layer 42 in the logic circuit region (leaving a block 42c of layer 42) and in the memory cell region (to define outer edges of the select gates 42b). An implant is then performed to form drain regions 48 in the memory cell area, and source and drain regions 50/52 in the logic circuit region. The final resulting structure is shown in FIGS. 2C and 3C (after photoresist removal).

As shown in FIG. 2C, the memory cells are formed in pairs that share a common source region 34 and a common erase gate 42a. Each memory cell includes a channel region 54 extending between the source (first) and drain (second) regions 34 and 48, and have a first portion disposed under the floating gate 14 and a second portion disposed under the select gate 42b. The control gate 18 is disposed over the floating gate 14. As shown in FIG. 3C, the logic devices each include a channel region 56 extending between the logic source and drain regions 50 and 52, and a logic gate 42c disposed over the channel region 56. One advantage of this memory formation process is to use only one logic gate poly layer to form the erase gate 42a, select gate 42b and logic gate 42c without having to use a dummy poly layer or an additional poly deposition step.

Figure 4A:
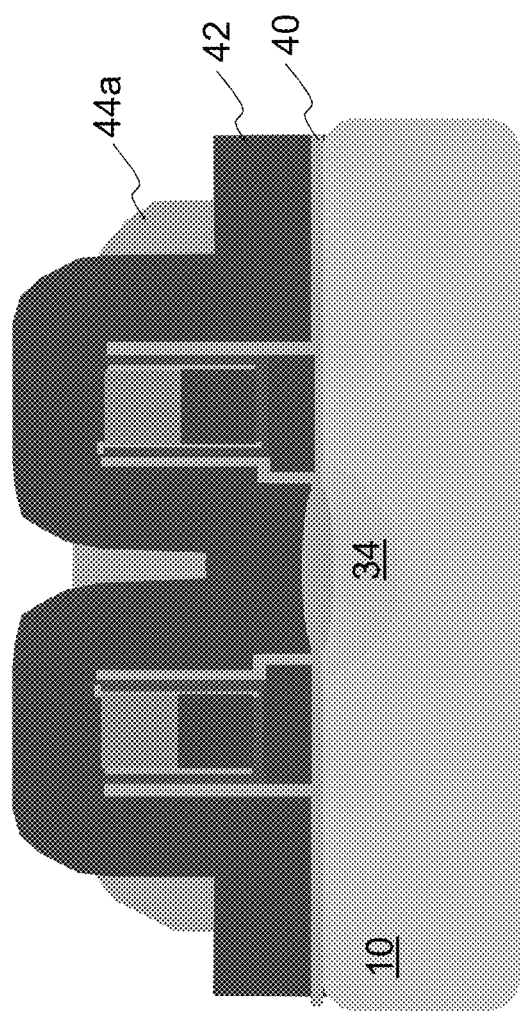
FIGS. 4A-4C are cross sectional views illustrating steps of an alternate embodiment in forming the memory cells.
Figure 4B:
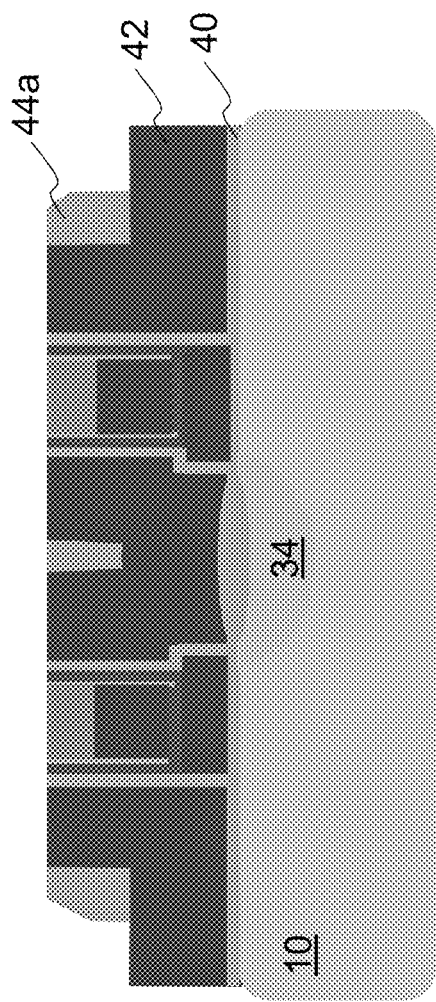
Figure 4C:
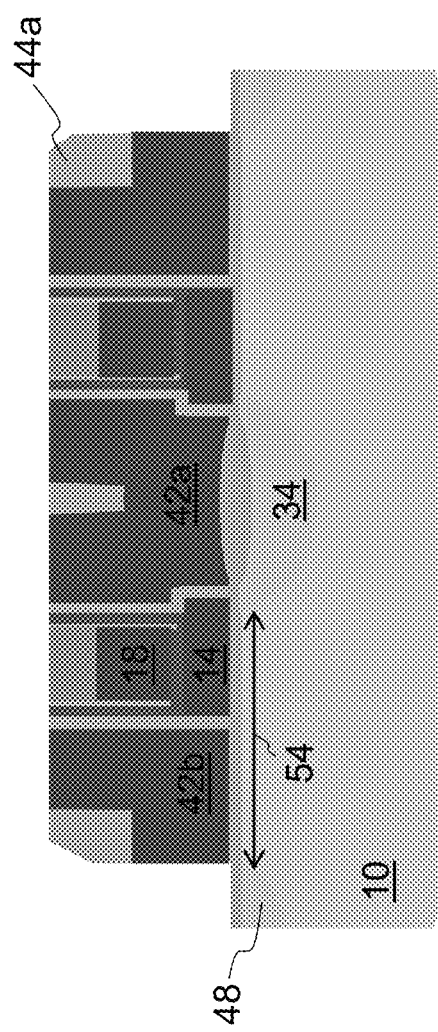

FIGS. 4A-4C illustrate an alternate embodiment for forming the memory cells, which begins with the same structure as that shown in FIG. 2A. However, instead of removing all of the buffer oxide 44 from the memory cell region, an anisotropical etch is used to leave buffer oxide spacers 44a on the poly layer 42, as shown in FIG. 4A. A CMP (chemical-mechanical polish) is used to planarize the top of the memory cell stack structure, as shown in FIG. 4B. A poly etch is then used to form the outer edges of the select gates 42b, and the drain regions 48 are formed as described above, as shown in FIG. 4C. The advantage of this embodiment is that the outer edges of the select gates 42b are self-aligned to and defined by buffer oxide spacers 44a.

Figure 5A:
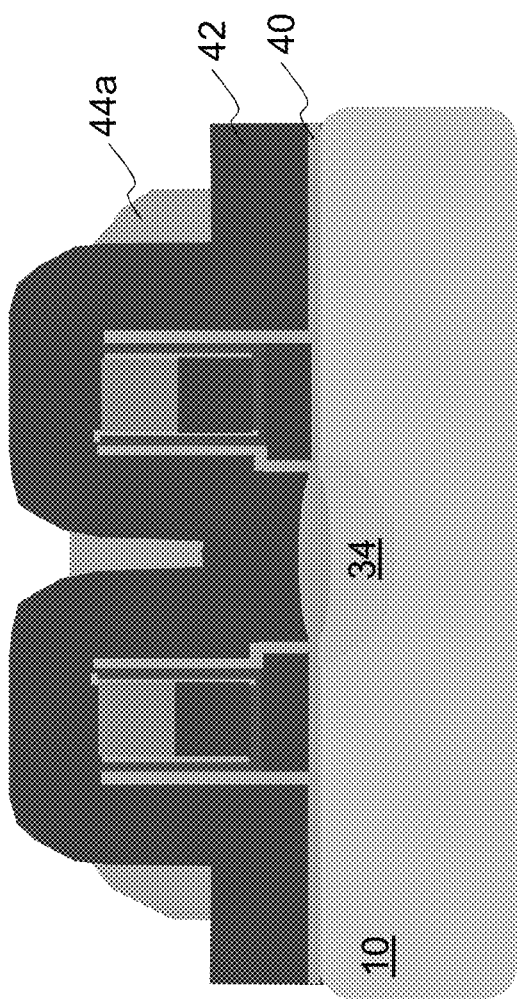
Figure 6A:
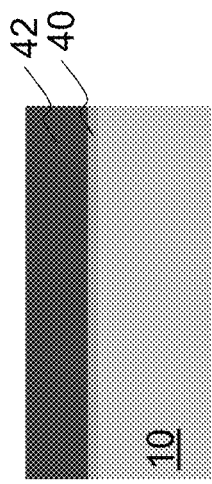
Figure 5B:
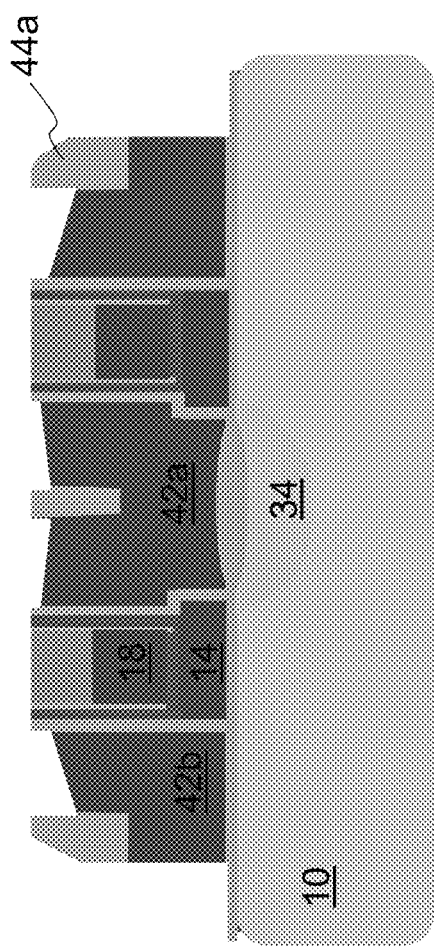
Figure 6B:
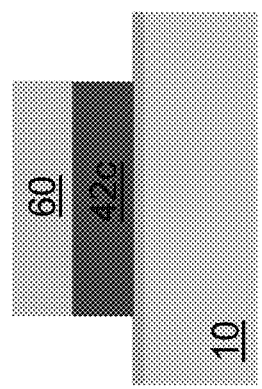

FIGS. 5A-5C and 6A-6C illustrate another alternate embodiment for forming the memory cells and logic devices, which begins with the same structures as that shown in FIGS. 2A and 3A. An anisotropical etch is used to remove buffer oxide 44 except buffer oxide spacers 44a in the memory cell region, and to remove buffer oxide 44 in the logic circuit region, as shown in FIGS. 5A and 6A, respectively. A block of photoresist 60 is formed in the logic circuit region by photoresist coating and selective photolithography removal. A poly etch is then performed, which removes the exposed portions poly layer 42 in the logic circuit region (resulting in logic gate 42c), removes the exposed portions of poly layer 42 in the outer regions (to define the outer edges of select gates 42b), and removes the upper portions of poly layer 42 on stacks S1 and S2 (to separate and define erase gate 42a and select gates 42b), as shown in FIGS. 5B and 6B. After photoresist removal, the memory drain regions 48, and the logic source and drain regions 50 and 52 are formed as described above, with the resulting structure shown in FIGS. 5C and 6C. An additional advantage of this embodiment is that not only is dummy polysilicon avoided, but so too is CMP (which some manufactures lack or find too expensive). Moreover, the same poly etch defines the memory cell region erase and select gates 42a/42b as well as the logic gate 42c.

Figure 7A:
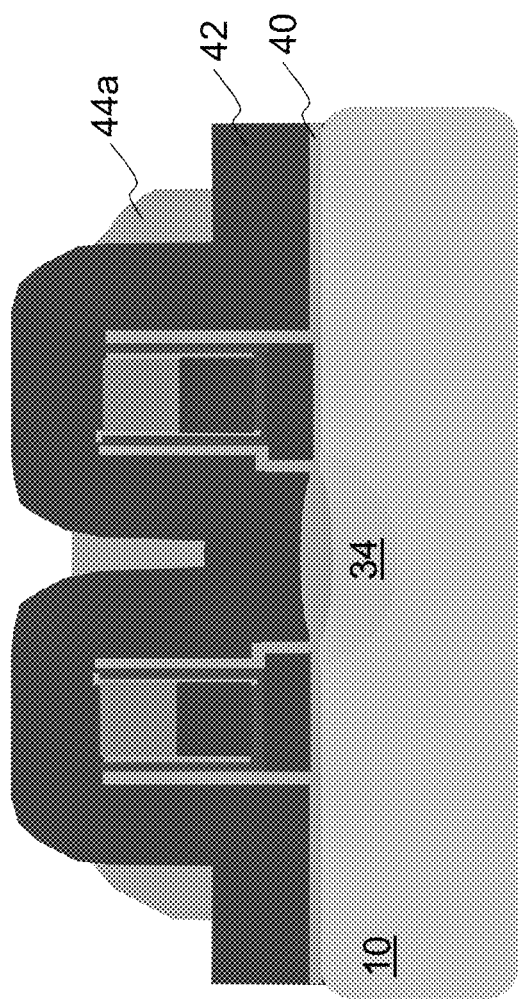
Figure 8A:
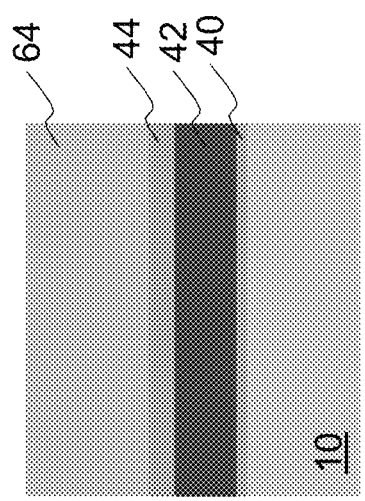
Figure 7C:
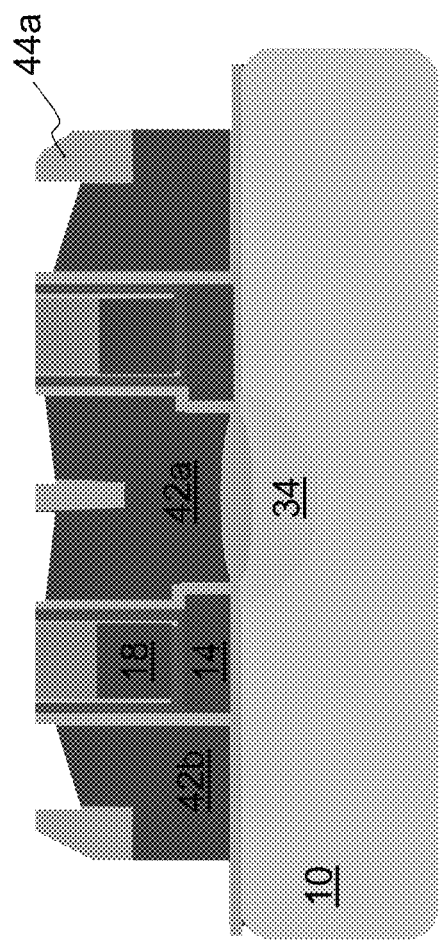
Figure 8C:
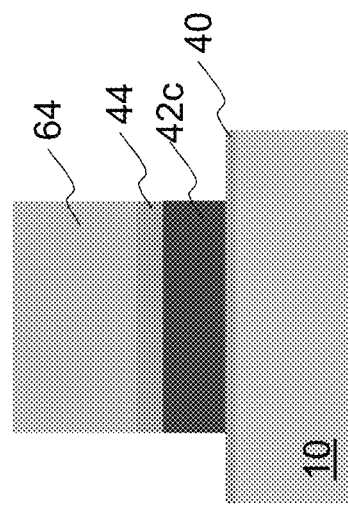

FIGS. 7A-7C and 8A-8C illustrate another alternate embodiment for forming the memory cells and logic devices, which begins with the same structures as that shown in FIGS. 5A and 6A except the buffer oxide 44 is left remaining in the logic circuit region (e.g. protected from the oxide etch by photoresist 64 formed in the logic circuit region), as shown in FIGS. 7A and 8A. A poly etch is then performed to remove the exposed portions of poly layer 42 in the outer regions (to define the outer edges of select gates 42b), and remove the upper portions of poly layer 42 on stacks S1 and S2 (to separate and define erase gate 42a and select gates 42b), as shown in FIGS. 7B and 8B. The photoresist 64 is then exposed, developed and selectively removed in the logic circuit region, followed by oxide and poly etches to remove the exposed portions of buffer oxide layer 44 and poly layer 42, leaving poly block 42c covered by buffer oxide 44 and photoresist 64, as shown in FIGS. 7C and 8C. The source and drain formation is then performed as described above. The advantage of this embodiment is that the buffer oxide 44 on logic gate 42c can better protect the underlying substrate from higher implantation energies so that higher voltage junctions can be formed for higher voltage logic devices. For low voltage logic devices, the buffer oxide 44 can be removed before implantation.

Figure 9B:
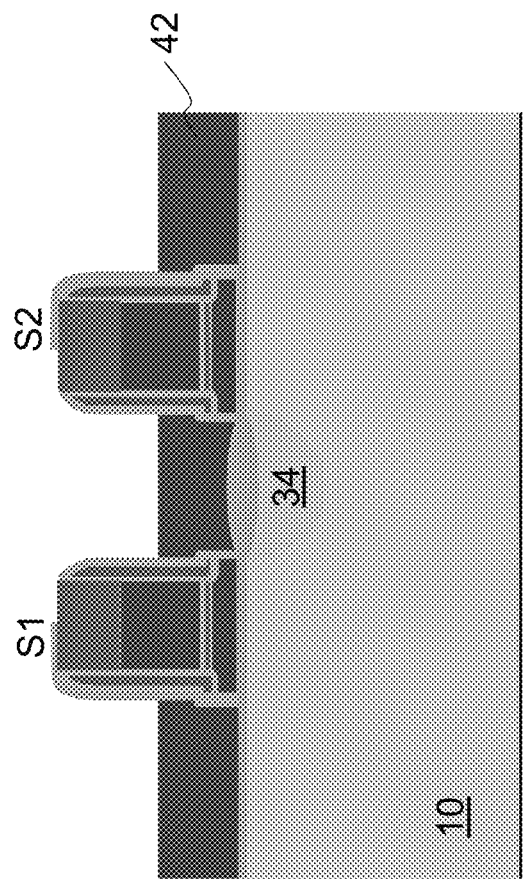

FIGS. 9A-9F, 10A-10F and 11A-11F illustrate another alternate embodiment for forming the memory cells and logic devices, which begins with the same structures as that shown in FIGS. 2B and 3B, as shown in FIGS. 9A (showing the memory cell region), 10A (showing a low voltage portion of the logic circuit region) and 11A (showing a high voltage portion of the logic circuit region). The low voltage portion of the logic circuit region includes a P-well (PWEL) region 70 and an N-well (NWEL) region 72, separated by an STI oxide 74. The high voltage portion of the logic circuit region includes a high voltage P-well (HPWL) region 76 and a high voltage N-well (HNWL) region 78, separated by STI oxide 74.

Figure 11B:
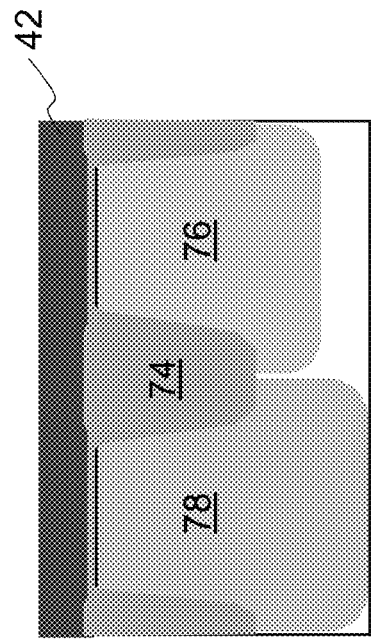
Figure 10B:
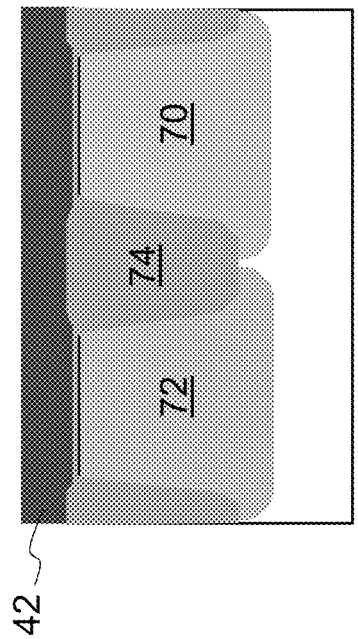

A dummy poly deposition, and poly etch (e.g., CMP followed by a poly etch back) are used to reduce the height of poly layer 42 well below the height of stacks S1 and S2, as shown in FIGS. 9B, 10B and 11B (after removal of buffer oxide 44 by oxide etch). Photoresist can be used to protect poly layer 42 in the logic circuit region. Oxide is deposited over the structure (e.g., TEOS deposition). Photoresist is coated on the oxide, patterned and selectively removed except for photoresist blocks 80 in the high voltage logic circuit region (which will define the logic gates in this region). An anisotropic oxide etch is performed, leaving spacers 82 in the memory cell region, and blocks 84 under the photoresist blocks 80 in the high voltage logic circuit region, as shown in FIGS. 9C, 10C and 11C. The spacers 82 will define the word line critical dimension (WL CD) in the memory cell region.

Figure 9D:
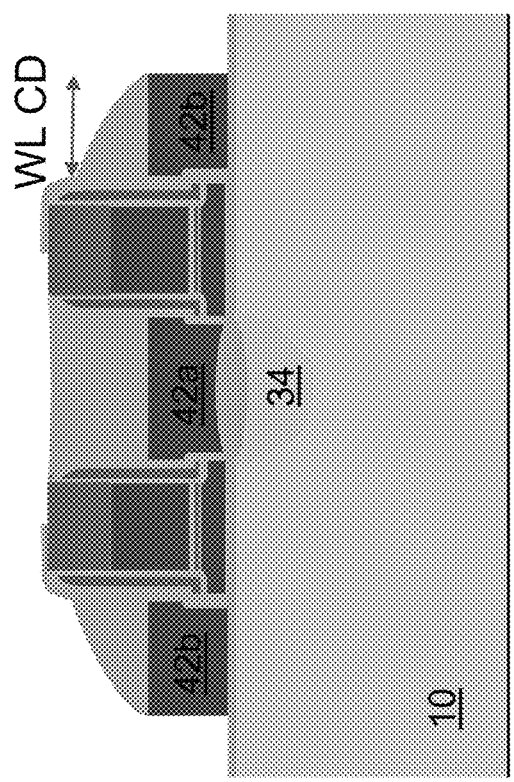
Figure 11D:
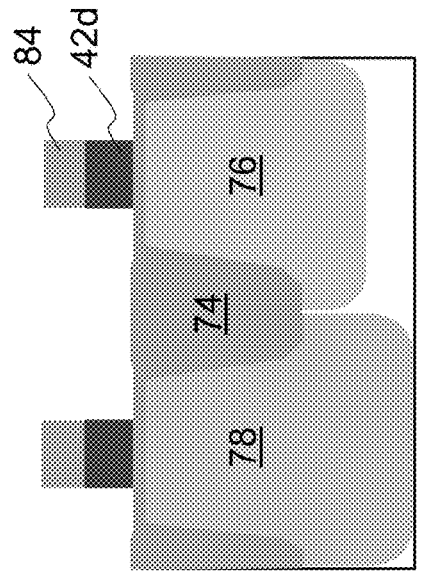
Figure 10D:
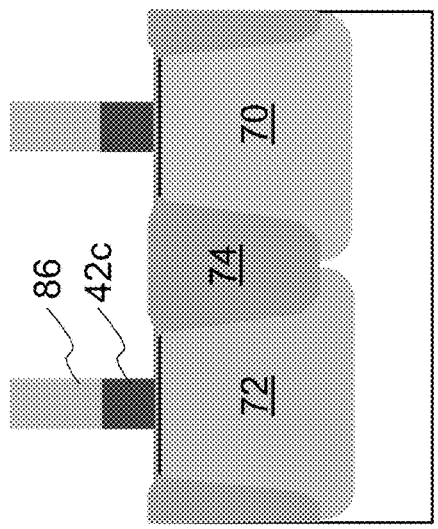

After photoresist removal, additional photoresist is coated on the structure, patterned and selectively removed except for photoresist blocks 86 in the low voltage logic circuit region (which will define the logic gates in this region). A poly etch is then used to remove the exposed portions of poly layer 42, leaving poly gates 42b in the memory cell region, poly gate 42c in the low voltage logic circuit region, and poly gate 42d in the high voltage logic circuit region, as shown in FIGS. 9D, 10D and 11D. Implantation is then used to form the drain regions 48 in the memory cell area, and source and drain regions 50/52 in the logic circuit region. The photoresist and oxide 82/84 are then removed, leaving the final structure shown in FIGS. 9E, 10E and 11E. The advantages of this embodiment include self-aligned formation of select gates 42b (by oxide spacers 82), and protection by oxide blocks 84 for higher source/drain implants in the high voltage logic circuit region.

Figure 13A:
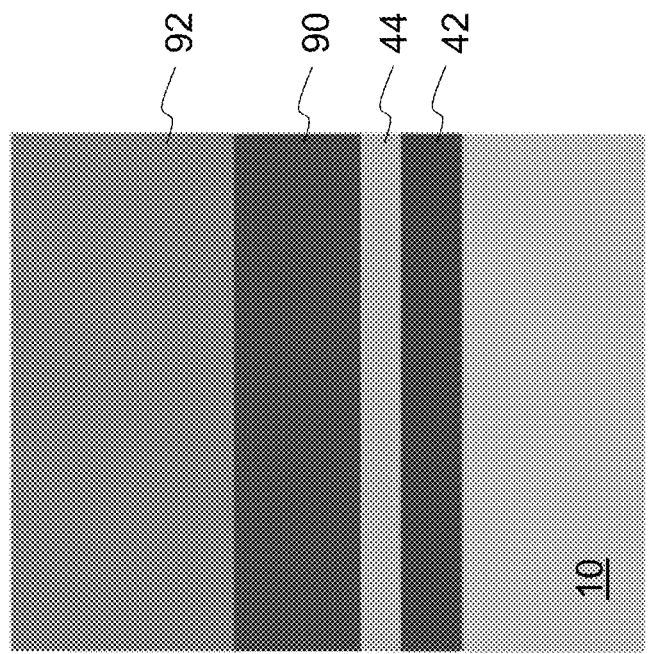
FIGS. 12A-12D and 13A-13D are cross sectional views illustrating steps of an alternate embodiment in forming the memory cells and the logic devices, respectively.
Figure 12A:
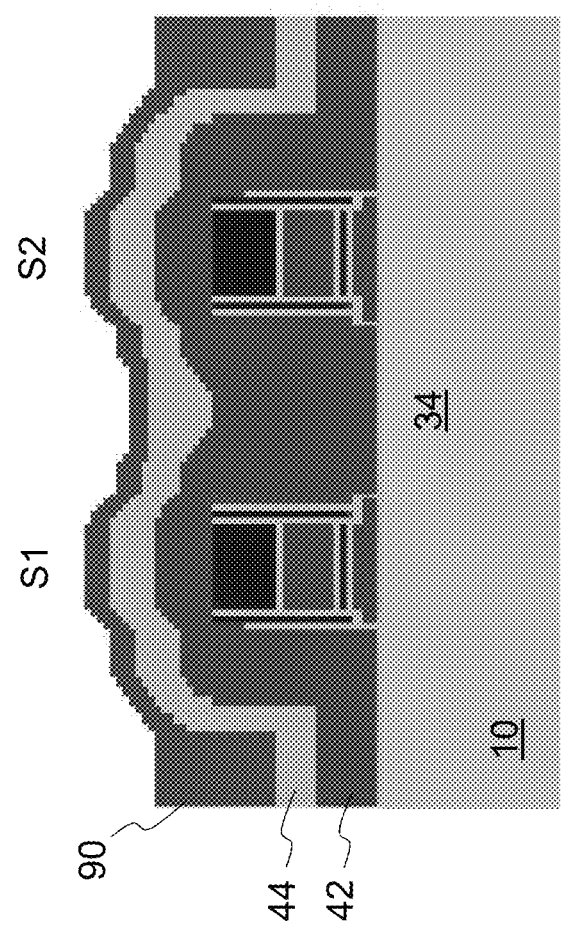
Figure 13B:
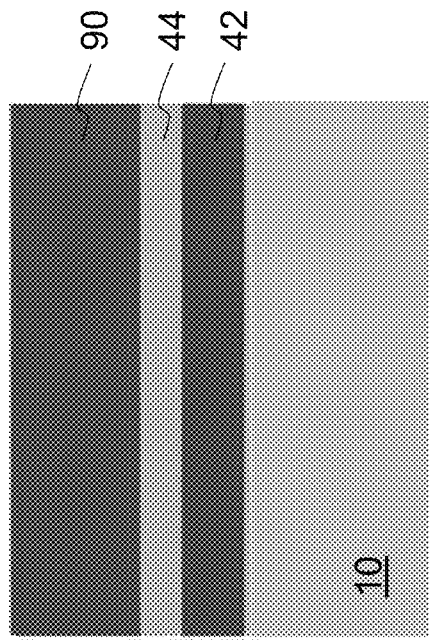
Figure 12B:
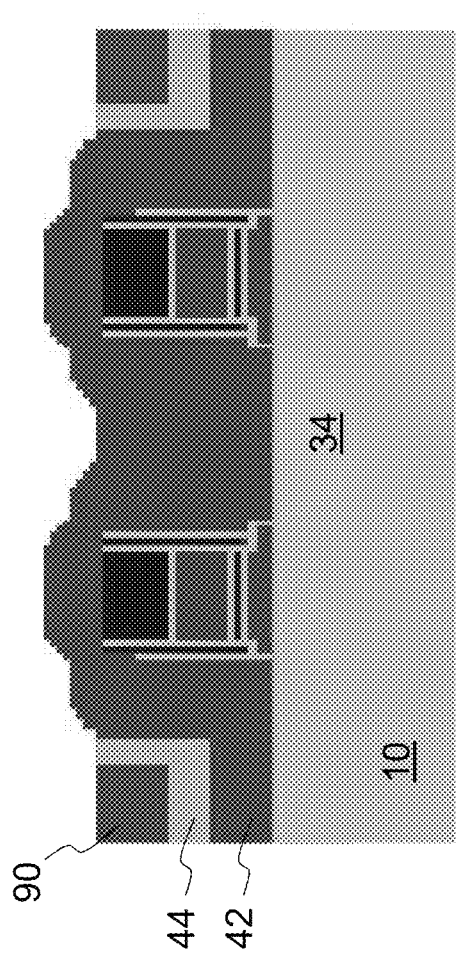
Figure 13C:
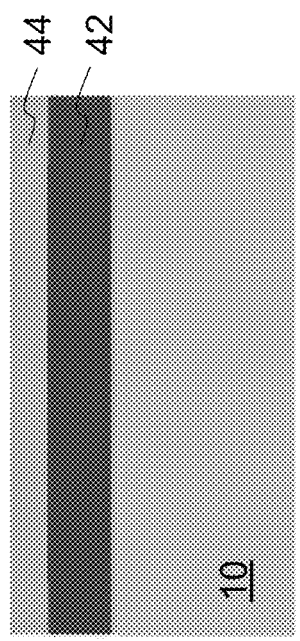
Figure 12C:
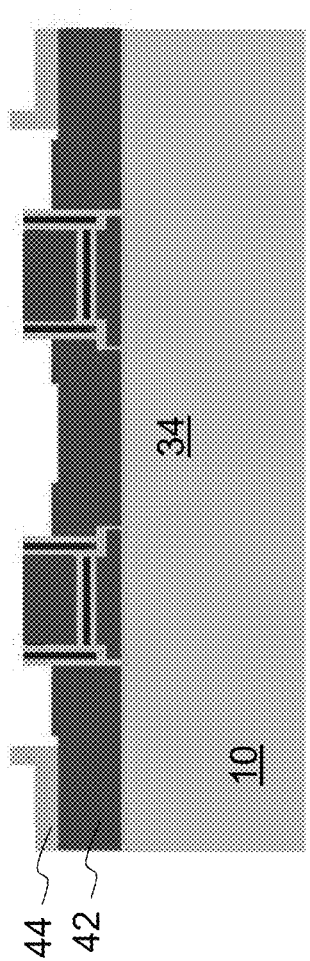
Figure 13D:
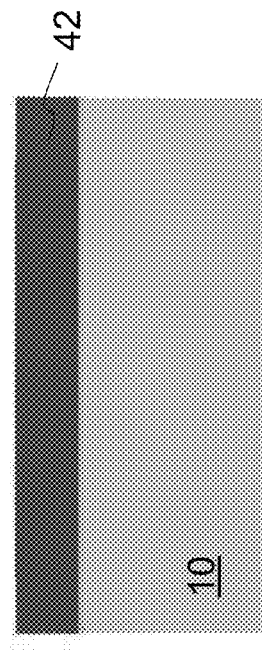
Figure 12D:
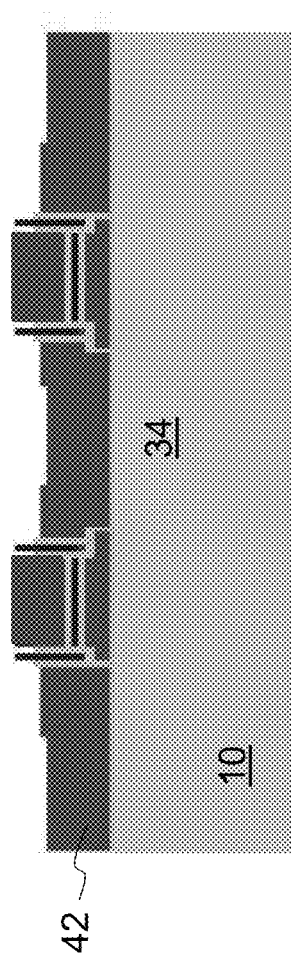

FIGS. 12A-12D and 13A-13D illustrate another alternate embodiment for forming the memory cells and logic devices, which begins with the same structures as that shown in FIGS. 2A and 3A, and oxide 44 is a blocking oxide. A BARC layer 90 is formed over oxide 44, and photoresist 92 is formed over oxide 44 and removed from the memory cell region but not from the logic circuit region, as shown in FIGS. 12A and 13A. A BARC etch back process and oxide etch back process (e.g., dry oxide etch) are used to remove the BARC layer 90 and oxide layer 44 over the tops of stacks S1 and S2 in the memory cell region, and shown in FIGS. 12B and 13B (after removal of photoresist 92). The remaining BARC material 90 is removed, and a poly etch is performed to remove the upper portion of poly layer 42 (to decrease the step height between the memory cell region and the logic circuit region), as shown in FIGS. 12C and 13C. Then, an oxide etch is then used to remove the remaining blocking oxide 44, resulting in the structure shown in FIGS. 12D and 13D. The structure can be processed as described above to complete the formation of the select gates, logic gates, memory drain regions, and logic source/drain regions.

Figure 15A:
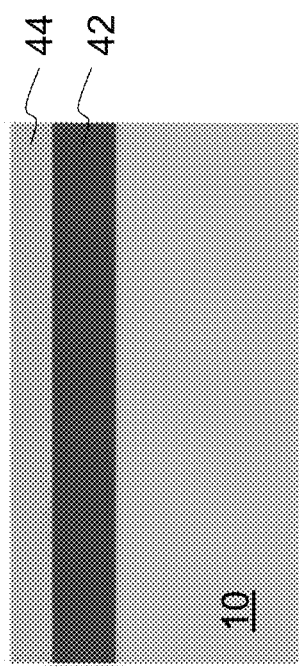
FIGS. 14A-14C and 15A-15C are cross sectional views illustrating steps of an alternate embodiment in forming the memory cells and the logic devices, respectively.
Figure 14A:
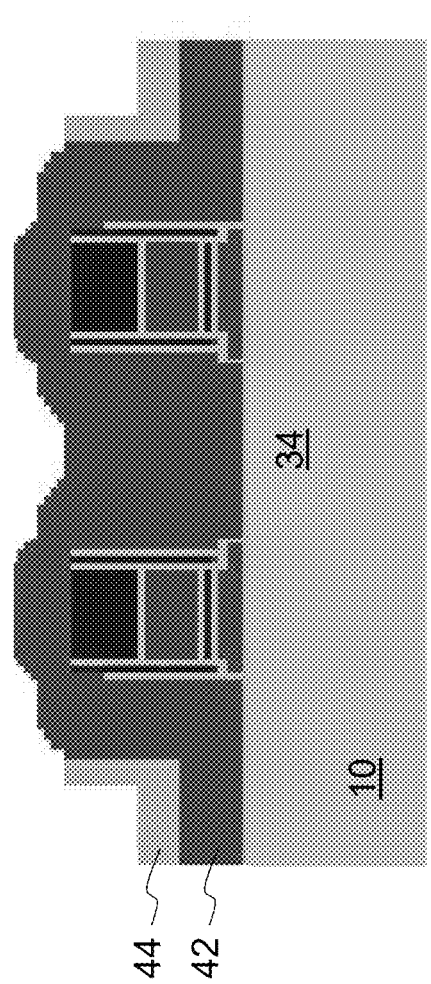
Figure 15B:
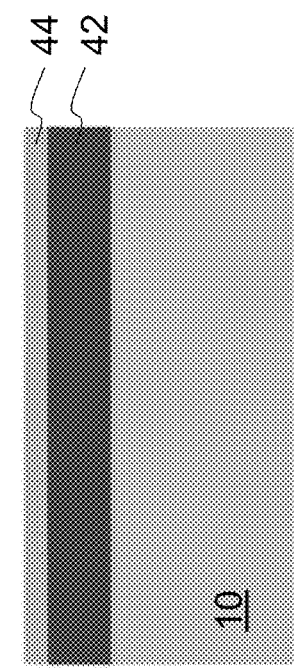
Figure 14B:
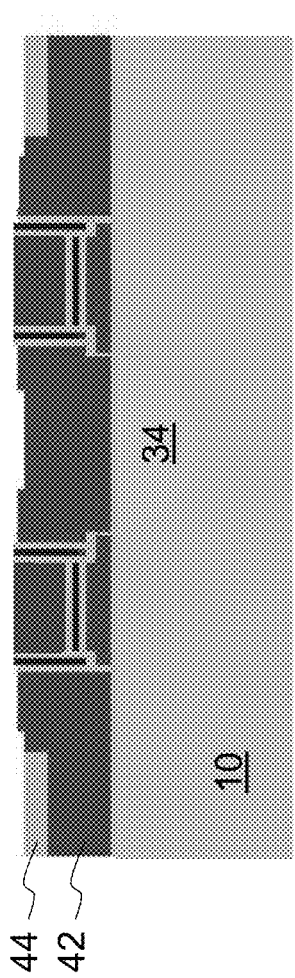
Figure 15C:
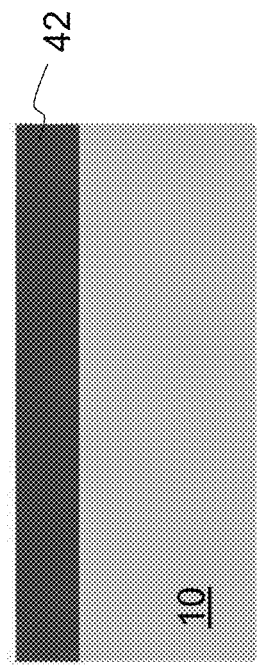
Figure 14C:
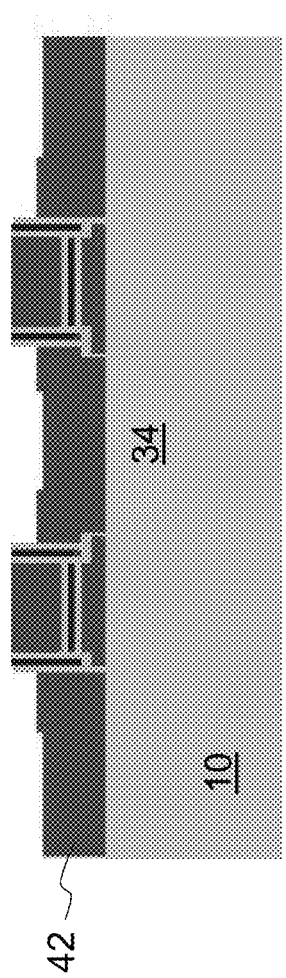

FIGS. 14A-14C and 15A-15C illustrate another alternate embodiment for forming the memory cells and logic devices, which begins with the same structures as that shown in FIGS. 12B and 13B. The BARC material 90 is first removed, as shown in FIGS. 14A and 15A. A CMP is used to remove the upper portions of the structure, as shown in FIGS. 14B and 15B. A poly etch back is used to lower the upper surfaces of poly layer 42 in the memory cell region, and an oxide etch is used to remove the remaining portions of oxide 44 in both regions, resulting in the structure shown in FIGS. 14C and 15C. The structure can be processed as described above to complete the formation of the select gates, logic gates, memory drain regions, and logic source/drain regions.

Figure 16A:
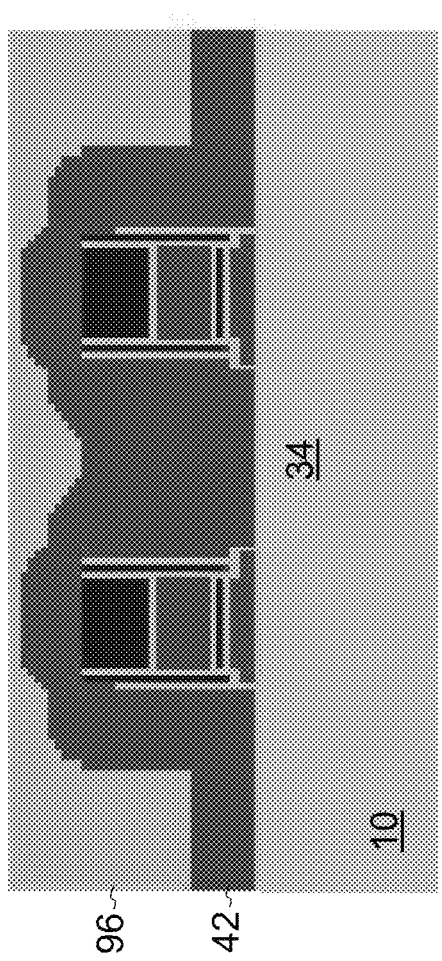
Figure 17A:
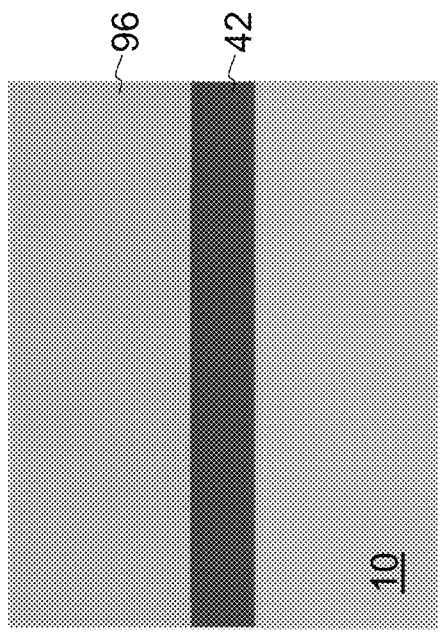
Figure 17C:
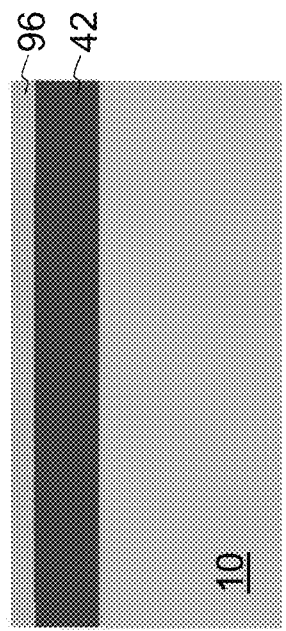
Figure 16C:
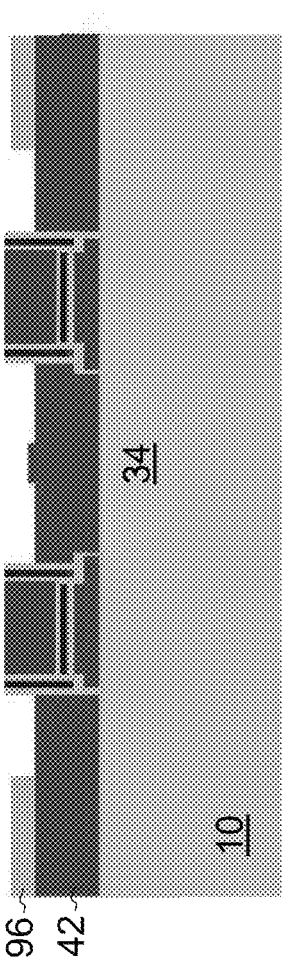
Figure 16D:
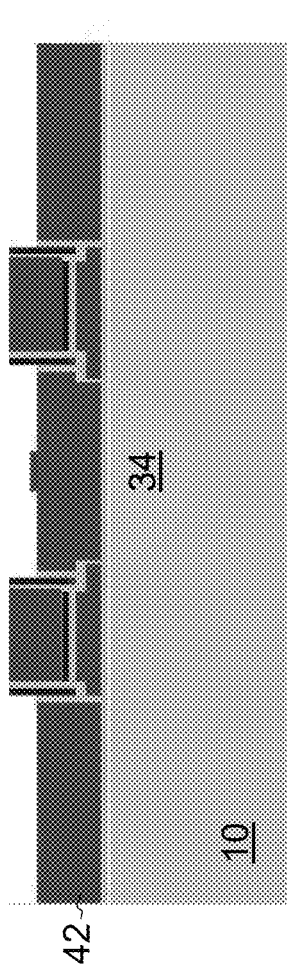
Figure 17D:
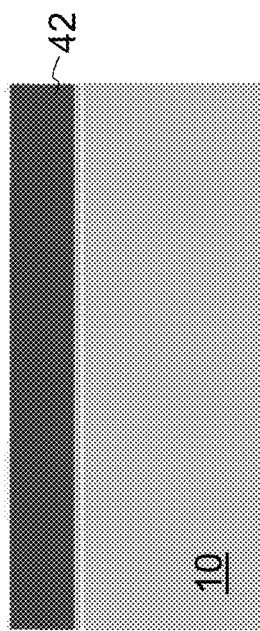

FIGS. 16A-16D and 17A-17D illustrate another alternate embodiment for forming the memory cells and logic devices, which begins with the same structures as that shown in FIGS. 2A and 3A, except oxide 44 is not formed. The structure is covered with a spin-on coating 96, such as a spin-on dielectric coating or a spin-on photoresist coating, as shown in FIGS. 16A and 17A. A global non-selective etch is performed based on time. When the poly layer 42 is exposed in the memory cell region, it is preferable to use a high etch selectivity against the poly (see FIGS. 16B and 17B). The global etch continues while monitoring the remaining poly thickness for the erase gate and the logic gate (see FIGS. 16C and 17C). Etch time can be determined by measurement results by APC (advanced process control). An etch is used to remove the remaining portions of coating 96, resulting in the structure shown in FIGS. 16D and 17D. The structure can be processed as described above to complete the formation of the select gates, logic gates, memory drain regions, and logic source/drain regions. The advantages of this embodiment are that no dummy poly is required, no poly CMP is required, using a spin-on coating flattens the surface, and the global etch means no mask is needed to open the memory cell region.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell of the present invention. Single layers of material could be formed as multiple layers of such or similar materials, and vice versa. The control gate can be omitted (by omitting the formation of poly layer 18 when forming stacks S1 and S2) for any of the above described embodiments to fabricate memory cells without any control gate.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a non-volatile memory cell comprising:
    providing a semiconductor substrate having a memory cell region and a logic circuit region;
    forming a pair of conductive floating gates disposed over and insulated from the memory cell region of the substrate;
    forming a first source region in the substrate between the pair of floating gates;
    forming a polysilicon layer over and insulated from the substrate in the memory cell region and the logic circuit region, wherein the polysilicon layer extends up and over, and is insulated from, the pair of conductive floating gates;
    performing a spin-on process to form a coating over the polysilicon layer in the memory cell and logic circuit regions;
    performing a non-selective etch to remove upper portions of the coating and the polysilicon layer to result in:
        a first block of the polysilicon layer disposed over the substrate and between the pair of conductive floating gate,
        a second block of the polysilicon layer disposed over the substrate with one of the pair of floating gates disposed between the first and second blocks of the polysilicon layer,
        a third block of the polysilicon layer disposed over the substrate with the other of the pair of floating gates disposed between the first and third blocks of the polysilicon layer, and
        a fourth block of the polysilicon layer disposed over and insulated from the logic circuit region of the substrate,
        wherein the non-selective etch results in the first block of the polysilicon layer being separated from the second and third blocks of the polysilicon layer;
    removing remaining portions of the coating;
    performing a polysilicon etch to remove portions of the second, third and fourth blocks of the polysilicon layer;
    forming a first drain region in the substrate adjacent a side of the second block of the polysilicon layer;
    forming a second drain region in the substrate adjacent a side of the third block of the polysilicon layer;
    forming a third drain region in the substrate adjacent a first side of the fourth block of the polysilicon layer; and
    forming a second source region in the substrate adjacent a second side of the fourth block of the polysilicon layer opposite the first side of the fourth block.

2. The method of claim 1, further comprising:
    forming a pair of conductive control gates each disposed over and insulated from one of the floating gates.

* * * * *